United States Patent [19]

Murata et al.

[11] Patent Number: 5,718,778
[45] Date of Patent: Feb. 17, 1998

[54] CHROMIUM TARGET AND PROCESS FOR PRODUCING THE SAME

[75] Inventors: Hideo Murata, Tottori-ken; Shigeru Taniguchi, Yasugi, both of Japan

[73] Assignee: Hitachi Metals, Ltd., Tokyo, Japan

[21] Appl. No.: 623,987

[22] Filed: Mar. 29, 1996

[30] Foreign Application Priority Data

Mar. 31, 1995 [JP] Japan ................... 7-099975

[51] Int. Cl.$^6$ ................................................. C22C 1/18
[52] U.S. Cl. ......................... 148/668; 148/423; 75/245; 419/28; 419/29
[58] Field of Search ..................... 148/423, 668; 420/428; 75/245; 419/28, 29, 61

[56] References Cited

FOREIGN PATENT DOCUMENTS

| | | | |
|---|---|---|---|
| 55-31129 | 3/1980 | Japan | 420/428 |
| 58-22379 | 2/1983 | Japan | 420/428 |
| 59-157282 | 9/1984 | Japan | 420/428 |
| 63-162863 | 7/1988 | Japan . | |
| 3-2230 | 1/1991 | Japan . | |
| 4-63134 | 10/1992 | Japan . | |
| 6-17246 | 1/1994 | Japan . | |

*Primary Examiner*—John Sheehan
*Attorney, Agent, or Firm*—Sughrue, Mion, Zinn, Macpeak & Seas, PLLC

[57] ABSTRACT

A chromium target is disclosed for use in the formation of chromium films or sheets of reduced thickness by means of sputtering. The target has a recrystallized structure represented by the equation, $A/B \leq 0.6$, where A is the diffraction intensity of the (110) planes as determined by X-ray diffraction of a sputtered surface, and B is the diffraction intensity as determined from the sum of the (110), (200) and (211) planes. The target preferably has a deflective strength of above 500 MPa and an average crystal grain of below 50 μm. The chromium target is produced by subjecting a starting chromium material to at least one stage of plastic working at a temperature of not higher than 1,000° C., and subsequently by heat-treating the resulting chromium material for recrystallization at a temperature of higher than the recrystallization temperature of the chromium material but not higher than 1,200° C.

7 Claims, 1 Drawing Sheet

INVENTION SPECIMEN NO. 3

(X100)

|←——→|
100 μm

INVENTION SPECIMEN NO. 3

(X 100)

|——————|
100 μm

COMPARATIVE SPECIMEN NO. 5

(X 100)

|——————|
100 μm

COMPARATIVE SPECIMEN NO. 6

(X 100)

|——————|
100 μm

CHROMIUM TARGET AND PROCESS FOR PRODUCING THE SAME

BACKGROUND OF THE INVENTION

The present invention relates to chromium targets suitable for use in the formation of thin films of pure chromium or chromium alloy by means of sputtering. The invention also relates to a process for producing such a chromium target.

In order to produce those thin chromium films which can stably exhibit excellent film characteristics, chromium targets have heretofore been required to be highly pure and dense. For instance, particulate chromium has been compacted by hot rolling in a container, thereby rendering the chromium great in its density, as disclosed in JP-A-6-17246. Also known from JP-A-63-162863 is a method in which highly pure chromium powder are allowed to solidify with the HIP process (Hot Isostatic Press). A vacuum dissolving-casting method is known, as taught by JP-B2-4-63134, as imparting high purity to the resultant chromium target. Further, the yield of a starting chromium material is increased, as is known from JP-B2-3-2230, by solidifying particulate chromium into a sintered body through the above powder sintering method, followed by hot rolling of that body with the result that a chromium material is made available in a plate-like form.

The chromium materials thus obtained are thereafter subjected to machining such that they are processed in the form of a target. Even with the above known methods used, however, the ultimate chromium targets are all brittle in nature and hence need handling with care. Another but serious problem is that larger dimensions are difficult to attain with those targets.

Liquid crystal displays amongst various electronic parts have of lately called for a high fineness quality. Chromium films derived from sputtering or the like have found application not only to electrode films and wiring films for use in liquid crystal-driven, thin-film elements and the like, but also to films used for color filters and called black matrices acting to block and partition light rays.

As regards the liquid crystal displays in particular, a keen demand has recently been voiced for the development of larger-dimensioned ones. To cope with this trend, chromium targets should be dimensionally large enough to provide a uniform chromium film over a substrate selected in producing such a larger liquid crystal display.

In the case where conventional chromium targets are used, the largest possible single body is dimensioned to be only about 250×600 mm in terms of a sputtering area. This flows mainly from brittleness of those targets. When a larger-dimensioned target is needed, for example, in the vicinity of about 500×700 mm that has been desired for the liquid crystal displays stated above, divided targets commonly called so in the art are necessarily utilized in which targets are first prepared as two- or three-divided parts and then adhesively bonded with the parts butted against each other on a copper-made fixing or backing plate used in firmly attaching the target to the associated sputtering apparatus.

The divided-type targets pose the problem that during formation of a chromium film by sputtering, arcing discharge tends to generate at between the boundaries of the butted target parts, resulting in development of abnormal chromium particles hereunder referred to as "PARTICLES". In most instances, the "PARTICLES" deposit on the associated substrate and eventually exert something defective on the resultant chromium film. Such arcing discharge should be avoided to preclude deterioration of film characteristics such as film thickness, film resistivity, film stress and various other important qualities.

In applying the chromium film to the above liquid crystal display or recording medium under layer, the corresponding chromium target needs access to high electric power so as to achieve shortened film formation and hence improved production efficiency. In this instance, the target is subjected on its front side to a temperature rise as it is hit by an argon ion and the like, and hence, is adversely affected by great thermal stress owing to the difference of thermal expansions between the hot target and the mating backing plate maintained cold. Thus, the target should be mechanically strong enough to withstand fracture or breakage.

In the conventional chromium targets not only of a class prepared by the aforesaid powder sintering method in which particulate chromium of high purity is made solid at elevated temperature and at elevated pressure, but also of a class prepared by the aforesaid vacuum dissolving-casting method, insufficient strength and hence objectionable fracture are encountered. In addition to their unacceptability to dimensional increases, such conventional targets cause fracture when having access to high electric power at the time of sputtering.

A further type of chromium target is known in which an ingot derived by the vacuum dissolving-casting method is machined. This target is extremely large in its crystal grain, say from 200 to 500 μm, and thus susceptible on its surface to stepped irregularities in an appreciable extent based on the individual crystal grains since the speed of sputtering is variable with the grains of crystals. This is often responsible for a greater amount of "PARTICLES". Too large a crystal grain noted here is taken to mean that it is made difficult to prevent cracking against proceeding under the influence of the grain boundaries. Consequently, such known target is wholly unsatisfactory in respect of mechanical strength.

Among the foregoing methods of the prior art, attention may be drawn to the method of JP-B2-3-2230 in which a sintered chromium body obtainable from powder sintering is further allowed to undergo hot rolling. The resulting target is highly dense and less breakable than those derivable by the other remaining methods. However, continued research made by the present inventors reveals that the target in question is still insufficient for a larger dimension to be feasible, nor is it satisfactory for fracture to be free in a larger-sized target as desired hereinbefore. Another finding is that the hot-rolled target is fibrous in structure as a result of rolling and hence anisotropic in crystal both in a direction along which rolling has been effected and in a direction defined at normal angle to the former direction. This in many cases results in an increase in "PARTICLES".

As improved types of chromium targets other than the foregoing counterparts, a certain target has been proposed in JP-B2-4-48868, which target is so contrived as to minimize oxygen and nitrogen as impurities particularly for use in a under layer film for magnetic recording media. JP-A-6-17246 discloses that some inclusions contained in the final target are decreased to thereby reduce "PARTICLES". These publications, however, provide nothing suggestive which could achieve improved strength and minimized "PARTICLES" for applicability to the above-desired large-sized chromium target.

SUMMARY OF THE INVENTION

The present invention, therefore, seeks to provide a chromium target which offers enhanced strength and minimized "PARTICLES" and enables great dimensions exceeding about 400×500 mm that corresponds to a sputtered area of greater than 0.2 m².

Further, the invention seeks to provide a process for the production of such chromium target.

The present inventors have made research on the structural details of various chromium targets in order to elucidate determinants of improved strength and reduced "PARTICLES" with particular regard to a greater-sized target. Through the research leading to the invention, it has now been found that high levels of strength and minimal amounts of "PARTICLES" can be achieved by the use of a target provided with a recrystallized structure in which a (110) plane is held to a minimum degree of orientation on a sputtering surface.

According to one important aspect of the invention, there is provided a chromium target for use in the formation of chromium films by means of sputtering, the chromium target having a recrystallized structure represented by the equation, $A/B \leq 0.6$, where A is the diffraction intensity of the (110) planes as determined by X-ray diffraction of a sputtering surface, and B is the diffraction intensity as determined from the sum of the (110), (200) and (211) planes.

In addition to meeting with the structural requirements specified above, the target of the invention should preferably have a deflective strength of more than 500 MPa and also a sputtered area of not less than 0.2 m².

Moreover, the target of the invention should preferably be adjusted in its crystal grain to not greater than 50 μm.

The process for target production of the invention is characteristic of plastic working at low temperatures combined with heat treatment for recrystallization of a chromium material at low temperatures. It should be noted that the modes of plastic working and heat treatment used herein are not known in the art for the production of chromium targets.

According to important aspect of the process invention, there is provided a process for the production of a chromium target, the process comprising: subjecting a starting chromium material to at least one stage of plastic working at a temperature of not higher than 1,000° C.; and subsequently heat-treating the resulting chromium material for recrystallization at a temperature of higher than the recrystallization temperature of the chromium material but not higher than 1,200° C., thereby providing a chromium target having a recrystallized structure represented by the equation, $A/B \leq 0.6$, where A is the diffraction intensity of the (110) planes as determined by X-ray diffraction of a sputtered surface, and B is the diffraction intensity as determined from the sum of the (110), (200) and (211) planes.

In the process of the invention, a plastic working temperature of not higher than 1,000° C. should preferably be set as the final plastic working temperature. This process can generally be run through plastic working typified by rolling. To accomplish the plastic working of a larger chromium target without involving adverse fracture, compacting is conducted by a powder sintering method utilizing an HIP so that the target can be heated and rolled as protected in an HIP can. The resultant compacted body, protected in that can, is fully prevented from getting oxidized and easily rolled because the body can be plastically deformed via the HIP can which is made of mild steel, for example.

Heating and processing for the plastic working can be done usually at several separate stages, but heating at each such stage is carried out preferably at the lowest possible temperature to suit thickness setting. This is necessary for processing strain to be introduced as much as possible at each working stage and hence for the (110) planes to be oriented to a limited degree. To that end, when the process of the invention is implemented with use of several working stages, the plastic working temperature on at least one stage is set at not higher than 1,000° C. at which to introduce processing strain.

Rolling which commences with a thick chromium material may in some cases need 2 to 4 cycles of heating, and one cycle of heating generally entails a plurality of rolling passes. At first and second rolling passes, the plastic working temperatures can be over 1,000° C. which may be rather favorable since thickness reduction is facilitated with improved processability.

At the last rolling pass where the target approaches a given thickness, however, the plastic working temperature is preferably maintained at not higher than 1,000° C. at which such working should be completed. Preferred temperatures at the last rolling pass range from about 950° to 900° C.

DETAILED DESCRIPTION OF THE INVENTION

Figure 1:
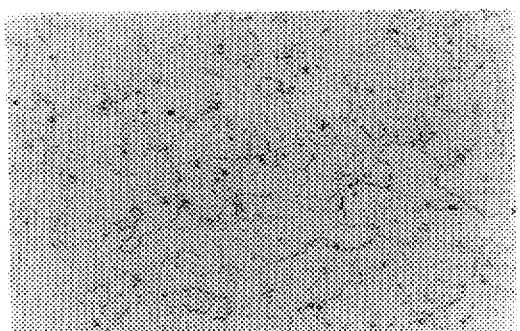
FIG. 1 is a photographic representation of an example of the metallic microstructure as to the chromium target embodying the present invention.

One of the most conspicuous features of the present invention is directed, as stated above, to adjusting a starting chromium material under certain specific conditions such that the resultant chromium target is provided with a recrystallized structure in which the (110) planes are oriented to a smaller degree on a sputtering surface, the (110) planes here being taken as the closest packed plane for chromium.

When a chromium target is produced by way of plastic working typically of rolling, strain remains in the target to a considerable extent after such working. The target so processed exhibits a structure having the (200) or (211) planes oriented to a large degree as a result of the plastic working. The resulting structure also simulates a so-called fibrous structure having the chromium crystals extended or displaced toward a direction along which plastic deformation (by rolling and the like) has been effected. If the plastically worked, residually strained body is forced into a target, then the ultimate target would be readily breakable due to the strain. At the time sputtering is effected, sudden relief of the strain having remained in the target would take place, giving rise to increased "PARTICLES".

According to the process of the invention, strain-remaining chromium is heated to relieve the strain and further recrystallized to switch over from a fibrous structure to a recrystallized structure in which the chromium crystals are rendered uniform in their grains. Upon heat treatment for recrystallization at elevated temperature, the chromium crystals would be oriented toward the (110) planes. A further rise in temperature for the heat treatment would orient the crystals in the direction of the (110) planes to a far larger degree.

It has been confirmed by the present inventors that excessive orientation of the chromium crystals toward the (110) planes results in impaired strength of the chromium target, causing ready fracture of the crystal grains from inside during handling and sputtering.

Such deterioration of strength makes the chromium target not only inaccessible to high electric power, but also liable to increase "PARTICLES". Although plastic working as by rolling and the like is effective for producing a large chromium target, the (110) planes may become greatly oriented with eventual decrease in the strength of the target, depending upon the conditions of heat treatment for removal of crystal anisotropy caused through the plastic working and of residual strain caused through the heat treatment. The present invention contemplates solving or eliminating, in a well-balanced manner, the dilemmatic problems of adverse anisotropy induced from the plastic working and of low strength induced from the heat treatment. Accordingly, the chromium target of the invention is adjusted to have a specified recrystallized structure in which the (110) planes are held to a minimal degree of orientation by the use of specified temperatures for the plastic working and recrystallization operation. This recrystallized structure is unknown in the art and peculiar to the invention.

More specifically, the recrystallized structure according to the invention is defined by the equation, $A/B \leq 0.6$, where $A$ is the diffraction intensity of the (110) planes as determined by X-ray diffraction of a sputtered surface, and $B$ is the diffraction intensity as determined from the sum of the (110), (200) and (211) planes. Larger $A/B$ values than 0.6 have now been found to produce no better results in regard to decreased fracture and reduced "PARTICLES" even with further improvements in the strength quality. The diffraction intensity of the (110) planes is preferred to be as small as possible when strength is further improved. In this respect, the $A/B$ values are preferably not greater than 0.5, more preferably not greater than 0.4.

Smaller orientation degrees of the (110) planes are advantageous in that a substrate of a larger dimension is useful for sputtering, coupled with improved strength noted above. Namely, when the orientation degree of the (110) planes is set at a small level, sputtered chromium particles having dashed out during the course of sputtering are less apt to take in adjacent atoms and rather easy to scatter in various directions. This allows a chromium film to be formed in a uniform thickness and over a wide area on the substrate, contributing greatly to improved distribution of film thicknesses that facilitates formation of such a film over a larger substrate. The (110) planes here act as the closest packed atom plane for chromium having a body-centered lattice.

Importantly, the chromium target of the invention should have a recrystallized structure as specified above. Because chromium crystals are oriented toward (211) and (200) planes by plastic working, a value of $A/B \leq 0.6$ can be obtained only as plastically worked. The target thus worked has remained therein strain induced from rolling and also provides a fibrous structure and thus becomes anisotropic in crystal in a direction along which the plastic working has been effected. Though acceptable in strength, such target is susceptible to fracture which is attributable to thermal stresses caused upon partial hitting of the target by an argon ion and the like and upon subsequent heating of the target. Another drawback is seen in increased "PARTICLES". The recrystallized structure of the chromium target according to the invention is intended to clear up those problems associated with residual strain and fibrous structure which are induced from the plastic working of a chromium material.

To carry out the process of the invention, heat treatment is done with processing strain introduced by plastic working and with the (110) planes oriented to a minimized degree. In such instance, the strength on the (200) and (211) planes is high as against that on the (110) planes. Crystal orientations eligible for the invention are defined to be $(200)/(110) \geq 0.4$ and $(211)/(110) \geq 0.3$ as determined by X-ray diffraction. These intensity ratios denote the magnitudes of orientation having remained on the (200) and (211) planes as a result of the plastic working. By the magnitudes of orientation here are meant those attained, in the process of the invention, by controlling temperatures of the plastic working and temperatures of heat treatment required for recrystallization after that working.

Strict observance of those structural requirements produces a target having a high deflective strength, say not less than 500 MPa, that constitutes one preferred embodiment of the invention. Such strength quality is determinable by a 3-pointed bending test stipulated in the JIS (Japanese Industrial Standard).

The target of the invention is rendered fine in its crystal grain, say not greater than 50 μm. This fine structure has a role to alleviate those stepped irregularities between grains of chromium crystals which would result from the crystals hit by an argon ion and the like in the course of sputtering. Hence, "PARTICLES" markedly decrease which would stem from the grain boundaries. The crystal grains in the recrystallized structure can be controlled through adjustments made to temperatures at which to perform heat treatment for recrystallization.

Recrystallization is preferably conducted, in the process of the invention, at a temperature of not higher than 1,200° C. At a temperature of, for example, 1,300° C. that is extremely higher than the recrystallization temperature of chromium, the resulting crystal grains of chromium would get objectionably coarsened owing to crystal grain growth.

To practice the process of the invention, at least one stage of plastic working is effected at a lower temperature not higher than 1,000° C., followed by heat treatment for recrystallization at a low temperature above the recrystallization temperature of chromium but not higher than 1,200° C. The chromium target of the invention has a recrystallization temperature of about 900° C. which, however, varies with the working conditions to be used. Setting of temperatures not higher than 1,000° C. at the one working stage mentioned above is based upon the reasoning that at temperatures of near to or lower than the recrystallization temperature of chromium, processing strain can be positively introduced to thereby lower the orientation of the (110) planes during the plastic working. A temperature of 950° C. or lower is preferred to introduce as much processing strain as possible in a chromium structure, thereby making the ultimate crystal grains fine.

To specify the plastic working temperatures in the process of the invention has significant purposes for cross-sectional reduction of a chromium target by plastic working, introduction of processing strain and lowering of orientation of the (110) planes. So long as these purposes are satisfied, a temperature not higher than 1,000° C. can be used at any one stage of the plastic working. Namely, usual forging or rolling may in some cases be run at several stages with heating and processing separated for easy operation, and such an operation mode is useful for the process of the invention. To that end, the temperature on at least one working stage is set at not higher than 1,000° C. so that processing strain is introduced. The strain once introduced is relievable by heating at a temperature higher than the temperature at which the strain has been introduced. Hence, the introduction of processing strain is efficiently done when the last working stage is set at 1,000° C. or lower. The temperature on the last working stage is preferably not lower than 700° C. since too low a temperature would lead to fracture during processing.

Subsequent heating at a temperature above the recrystallization temperature relieves the strain having remained in a chromium microstructure after the plastic working, thus developing recrystallization in that microstructure. The temperature at this time is preferably set to be higher than a temperature at the last stage in which processing strain is finally introduced. The process of the invention is comprised to conduct heating at 1,200° C. or lower. Heating at temperatures higher than 1,200° C. would orient the (110) planes to a great degree, and moreover, would coarsen the final crystal grains as set forth hereinabove.

In the practice of the invention, the content of elements such as oxygen, nitrogen and carbon in a chromium film is preferably held to an absolute minimum, which elements would deteriorate the characteristics of the film such as specific resistivity and the like. The sum content of such three elements is preferably not more than 2,000 ppm. In particular, larger contents of oxygen would invite formation of chromium oxides, causing impaired strength of the ultimate chromium target and adverse fracture in a large-sized chromium target. The content of oxygen alone is preferably not more than 400 ppm.

The present invention is suitably applicable not only to targets solely of chromium, but also to those composed of chromium and other elements incorporated to improve stress relief, oxidation resistance and the like among various film characteristics desired. Suitable alloying elements used herein are chosen from Ti, Zr, Hf, V, Nb, Ta, W, Mo, Ru, Pt and the like. They may be used singly or in combination. The amount of the alloying element to be added is less than 15% by atom since the element is liable to change the interatomic distance in a chromium film, hence deteriorating the characteristics inherent to such film.

The following examples are given to further illustrate the present invention.

EXAMPLE 1

Into a mild steel-made can (HIP can) for a hot isostatic press (HIP) was particulate all-chromium prepared to be not less than 99.9% in purity and 100 μm in maximum particle size adjusted to below 100 meshes. Degasing was conducted with a vacuum pump at $3 \times 10^{-2}$ Pa. Upon subsequent HIP-treatment at 1,000° C. and at 100 MPa for 2 hours, a compacted body as carried by a ferrous skin of the HIP can was heated at 1,250° C. and subjected to 3 passes at a reduction of about 18% per one pass. After further heating at 1,250° C., additional 3 passes were continued at a reduction of about 18% per one pass. A total of 6 passes were done. Rolling was run at a total draft of 70%. The final rolling temperature at the 6th pass was set at 900° C.

The resulting rolled material as carried by the ferrous skin was heat-treated at the varying temperatures shown in Table 1, followed by machining of the rolled material after removal of the skin, thereby providing a flat plate-like chromium target of 500×700×10 t(mm) in dimension and 0.35 m² in sputtered area. Specimens were cut out of the same rolled material as was used to obtain the target. Measurement was made of crystal orientation by X-ray diffraction and 3-pointed deflective strength by the JIS standards in regard to the respective rolled surfaces that were eventually made as sputtered surfaces, the results being shown in Table 1.

As for the crystal orientation shown in Table 1, A/B is expressed by A being the diffraction intensity of the (110) planes as determined by X-ray diffraction of a sputtered surface, and B being the diffraction intensity as determined from the sum of the (110), (200) and (211) planes. B is a measure of the orientation degree of the (110) plane.

Further examination was made of the structure, crystal grain and contents of oxygen, nitrogen and carbon after heat treatment with the results shown in Table 2.

To facilitate comparison, chromium targets derived from a vacuum dissolving-casting induced chromium material were likewise examined with the results shown also in Table 1 and 2. The comparative target of specimen 7 as cast involved cracks upon cooling during casting, failing to warrant use as targets for practical purposes. The X-ray diffraction intensity of the vacuum dissolving-casting induced material was substantially identical to that of random-oriented chromium.

With use of different targets corresponding to cracks-free specimens 1 to 6 of Tables 1 and 2, sputtering was effected on a glass substrate with argon pressure, 0.3 Pa; electric power per unit area of sputtered target surface, 50 kW/m²; substrate temperature, 200° C.; and film thickness, 300 nm. Inspection was done as to the number of "PARTICLES" developed with a particle size of not less than 0.2 μm with the results shown also in Table 2.

TABLE 1

| Specimen | Heat treatment temp. °C. | A/B | X-ray diffraction intensity (200)/(110) | (211)/(110) | Deflective strength MPa | Remark |
|---|---|---|---|---|---|---|
| 1 | 1,200 | 0.57 | 0.42 | 0.32 | 520 | Invention specimen |
| 2 | 1,100 | 0.42 | 0.77 | 0.56 | 530 | Invention specimen |
| 3 | 1,000 | 0.30 | 1.25 | 1.06 | 545 | Invention specimen |
| 4 | 900 | 0.18 | 3.20 | 2.55 | 650 | Invention specimen |
| 5 | 800 | 0.08 | 5.95 | 5.23 | 700 | Comparative specimen |
| 6 | 1,300 | 0.76 | 0.16 | 0.15 | 405 | Comparative specimen |
| 7 | as cast | 0.68 | 0.16 | 0.30 | 195 | Comparative specimen |

TABLE 2

| Specimen | Structure | Crystal grain μm | O ppm | N ppm | C ppm | "PARTICLES" the number/m² | Remark |
| --- | --- | --- | --- | --- | --- | --- | --- |
| 1 | Recrystallized | 50 | 180 | 30 | 30 | 150 | Invention specimen |
| 2 | Recrystallized | 49 | 160 | 25 | 25 | 152 | Invention specimen |
| 3 | Recrystallized | 46 | 155 | 28 | 30 | 130 | Invention specimen |
| 4 | Recrystallized | 36 | 160 | 28 | 25 | 165 | Invention specimen |
| 5 | Fibrous | — | 170 | 26 | 25 | 320 | Comparative specimen |
| 6 | Recrystallized | 75 | 135 | 25 | 28 | 220 | Comparative specimen |

Figure 2:
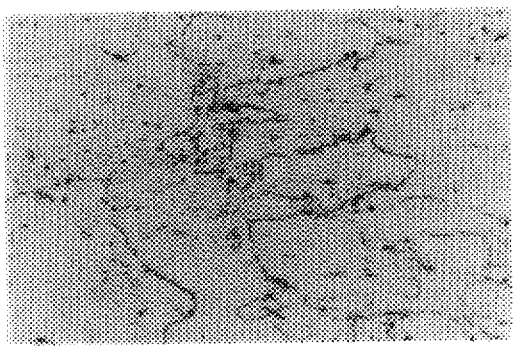
FIG. 2 is a photographic representation of an example of the metallic microstructure as to a comparative chromium target devoid of recrystallization.
Figure 3:
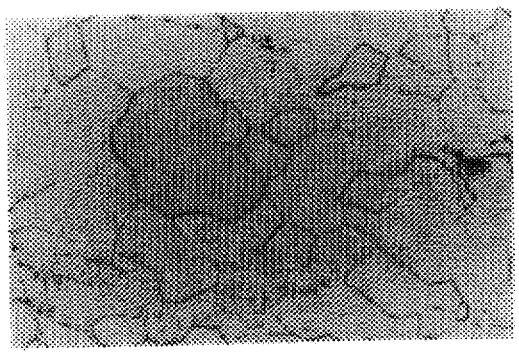
FIG. 3 is a photographic representation of an example of the metallic microstructure as to a comparative chromium target having the (110) planes oriented to a large degree.

Depicted in FIGS. 1 to 3 are the micro-structural photographs, as magnified by 100 times, respectively, of inventive specimen 3, comparative specimen 5 in which heat treatment for recrystallization was run at a low temperature, and comparative specimen 6 having the (110) planes oriented to a large degree as a result of recrystallization.

As is clear from FIG. 2, the fibrous structure caused at the time of rolling is maintained as it is in comparative specimen 5 in which heat treatment for recrystallization was conducted at a temperature below the final working temperature of 900° C. This means that no recrystallization took place. Comparative specimen 5 is the highest in deflective strength of all specimens 1 to 7, but revealed an undesirable, sharp rise in "PARTICLES" that resulted from sputtering of a fibrously structured target.

Inventive specimens 1 to 4 are of a recrystallized structure. Though relatively low in deflective strength as compared to the fibrously structured targets, these inventive specimens are extremely small with respect to "PARTICLES" with A/B values of not greater than 0.6.

Comparative specimen 6 having an A/B value over 0.6 and having the (110) planes oriented to a large degree showed a sharp decline in deflective strength. Namely, the greater the degree of orientation toward the (110) planes, the lower deflective strength.

The crystal grain in a recrystallized structure tends to become larger as the temperature of heat treatment for recrystallization is higher. In the process of the invention, therefore, the lowest possible temperature is selected from a range of temperatures not exceeding 1,200° C. but enabling recrystallization.

EXAMPLE 2

Particulate all-chromium of not less than 99.9% in purity similar to that used in Example 1 was prepared and placed in a mild steel-made can (HIP can) for a hot isostatic press (HIP), followed by degasing with a vacuum pump at $3 \times 10^{-2}$ Pa. HIP-treatment was then carried out at 1,000° C. and at 100 MPa for 2 hours. A compacted body carried by a ferrous skin of the HIP can was rolled with 6 passes as was in Example 1 and at a total draft of 70%. The final rolling temperature at the 6th pass was set at from 800° to 1,100° C. as listed in Table 3.

The resulting rolled material was heat-treated at 1,000° C. and subjected to machining to thereby remove the skin, after which a flat plate-like target of 500×700×10 t(mm) in dimension and 0.35 m² in sputtering area was provided. Specimens were cut out of the same rolled material as was used to obtain the target. As in Example 1, performance evaluation was made of crystal orientation by X-ray diffraction and 3-pointed deflective strength by the JIS standards in regard to the respective rolled surfaces that were ultimately made as sputtered surfaces, the results being shown in Table 3.

Checking was further done, as in Example 1, of the structure, crystal grain and contents of oxygen, nitrogen and carbon after heat treatment with the results shown in Table 4.

TABLE 3

| Specimen | Final rolling temp. °C. | X-ray diffraction intensity | | | Deflective strength MPa | Remark |
| --- | --- | --- | --- | --- | --- | --- |
| | | A/B | (200)/(110) | (211)/(110) | | |
| 8 | 800 | 0.29 | 1.32 | 1.10 | 580 | Invention specimen |
| 9 | 900 | 0.30 | 1.25 | 1.06 | 545 | Invention specimen |
| 10 | 950 | 0.32 | 1.19 | 0.98 | 527 | Invention specimen |
| 11 | 1,000 | 0.47 | 0.63 | 0.52 | 504 | Invention specimen |
| 12 | 1,100 | 0.62 | 0.42 | 0.36 | 433 | Comparative specimen |

TABLE 4

| Specimen | Structure | Crystal grain μm | O ppm | N ppm | C ppm | "PARTICLES" the number/m² | Remark |
| --- | --- | --- | --- | --- | --- | --- | --- |
| 8 | Recrystallized | 38 | 132 | 27 | 29 | 137 | Invention specimen |
| 9 | Recrystallized | 48 | 152 | 30 | 29 | 132 | Invention specimen |

TABLE 4-continued

| Specimen | Structure | Crystal grain μm | O ppm | N ppm | C ppm | "PARTICLES" the number/m² | Remark |
|---|---|---|---|---|---|---|---|
| 10 | Recrystallized | 72 | 150 | 24 | 21 | 152 | Invention specimen |
| 11 | Recrystallized | 87 | 141 | 22 | 30 | 150 | Invention specimen |
| 12 | Recrystallized | 120 | 138 | 31 | 28 | 183 | Comparative specimen |

As demonstrated by the results of Tables 3 and 4, final working temperatures above 1,000° C. are ineffective to make crystal grains of chromium fine even after heat treatment for recrystallization. Moreover, since the X-ray diffraction intensity is nearly random, high deflective qualities of above 500 MPa are unfeasible with the comparative specimens as strongly contrasted to the inventive specimens.

Inventive specimens 8 to 11 are noticeably great in deflective strength, as against comparative specimen 12, with fine crystal grains and "PARTICLES" in small amounts. Thus, these inventive specimens have been proved to be highly reliable.

Here, inventive specimen 11 in which the final rolling temperature was set at 1,000° C. is slightly lower in deflective strength and somewhat larger than in crystal grain than the other inventive specimens, but to an acceptable extent.

EXAMPLE 3

Particulate all-chromium of not less than 99.9% in purity as in Example 1, particulate molybdenum, particulate titanium and particulate niobium, the latter three elements each having a purity of not less than 99.9% and classified at below 100 meshes, were mixed into the different compositions listed in Table 5. The resulting chromium alloy was put into a mild steel-made can (HIP can) for a hot isostatic press (HIP) and degased with a vacuum pump at $3 \times 10^{-2}$ Pa, followed by HIP-treatment of the alloy at 1,000° C. and at 100 MPa for 2 hours. The compacted body so obtained and carried by a ferrous skin of the HIP can was rolled with 6 passes as in Example 1 and at a total draft of 70%. The final rolling temperature at the 6th pass was set at 900° C.

The resultant rolled material derived from the alloy and still carried by the ferrous skin was heat-treated at 1,000° C. and machined to remove that skin, whereupon there was provided an alloy target of 500×700×10 t(mm) in dimension and 0.35 m² in sputtered area. Specimens were cut out of the same rolled material as used to produce the target. As in Example 1, performance evaluation was made of crystal orientation by X-ray diffraction and 3-pointed deflective strength by the JIS standards in regard to the respective rolled surfaces that were eventually made as sputtered surfaces, the results being shown in Table 5.

Measurement was made, also as in Example 1, of the structure, crystal grain and content of oxygen, nitrogen and carbon after heat treatment, and the number of "PARTICLES" caused during sputtering with the results shown in Table 6.

TABLE 5

| Specimen | Composition at % | X-ray diffraction intensity | | | Deflective strength MPa | Remark |
|---|---|---|---|---|---|---|
| | | A/B | (200)/(110) | (211)/(110) | | |
| 13 | 95Cr-5Nb | 0.57 | 0.42 | 0.32 | 520 | Invention specimen |
| 14 | 95Cr-5Ti | 0.42 | 0.77 | 0.56 | 534 | Invention specimen |
| 15 | 90Cr-10Mo | 0.30 | 1.25 | 1.06 | 572 | Invention specimen |
| 16 | 88Cr-12W | 0.32 | 1.13 | 0.97 | 563 | Invention specimen |

TABLE 6

| Specimen | Structure | Crystal grain μm | O ppm | N ppm | C ppm | "PARTICLES" the number/m² | Remark |
|---|---|---|---|---|---|---|---|
| 13 | Recrystallized | 50 | 245 | 32 | 42 | 200 | Invention specimen |
| 14 | Recrystallized | 49 | 320 | 33 | 32 | 174 | Invention specimen |
| 15 | Recrystallized | 46 | 431 | 50 | 29 | 272 | Invention specimen |
| 16 | Recrystallized | 45 | 225 | 28 | 18 | 187 | Invention specimen |

High deflective strength qualities of above 500 MPa are attainable with the inventive alloys if A/B≦0.6 is met as is apparent from Tables 5 and 6. Also in view of the number of "PARTICLES", these alloys are favorably comparable to the inventive all-chromium specimens shown in Tables 1 and 2.

As shown and described above, the chromium target according to the present invention is highly conducive to enhanced mechanical strength and to decreased "PARTICLES". The reason for this is that in spite of its recrystallized structure, such target has the (110) planes held to a minimized degree of orientation. Thus, the target of the invention is capable of clearing up target fracture experienced during handling at the time of production particularly in the case of a large-sized target of not less than 0.2 m² in sputtered area as well as target fracture caused by thermal stress during sputtering and development of objectionable "PARTICLES" caused in the course of sputtering.

The chromium target of the invention enjoys high credit for use in liquid crystal displays of a greater dimension that have recently dominated.

What is claimed is:

1. A chromium target for use in the formation of chromium films by means of sputtering, the chromium target having a recrystallized structure represented by the equation, $A/B \leq 0.6$, where A is the diffraction intensity of the (110) planes as determined by X-ray diffraction of a sputtering surface of the target, and B is the diffraction intensity as determined from the sum of the (110), (200) and (211) planes.

2. The chromium target according to claim 1, having a deflective strength of not less than 500 MPa.

3. The chromium target according to claim 1, having a sputtering area of not less than 0.2 m².

4. The chromium target according to claim 1, having an average crystal grain size of not greater than 50 μm.

5. A chromium target according to claim 1, having a deflective strength of not less than 500 Mpa, a sputtering area of not less than 0.2 m², and an average crystal grain size of not greater than 50 μm.

6. A process for the production of a chromium target, the process comprising: subjecting a starting chromium material to at least one stage of plastic working at a temperature of not higher than 1,000° C.; and subsequently recrystallization heat-treating the resulting chromium material at a temperature of not lower than the recrystallization temperature of the chromium material but not higher than 1,200° C., thereby providing a chromium target having a recrystallized structure represented by the equation, $A/B \leq 0.6$, where A is the diffraction intensity of the (110) planes as determined by X-ray diffraction of a sputtering surface of the target, and B is the diffraction intensity as determined from the sum of the (110), (200) and (211) planes.

7. The process of claim 6, wherein the final stage of plastic working is effected at a temperature of not higher than 1,000° C.

* * * * *